United States Patent [19]
Nagaraj

[11] Patent Number: 5,770,976
[45] Date of Patent: Jun. 23, 1998

[54] LOCAL CLOCK DUTY CYCLE INDEPENDENT PHASE DETECTOR AND METHOD OF OPERATION THEREOF

[75] Inventor: Krishnaswamy Nagaraj, Somerville, N.J.

[73] Assignee: Lucent Technologies Inc., Murray Hill, N.J.

[21] Appl. No.: 762,021

[22] Filed: Dec. 11, 1996

[51] Int. Cl.$^6$ .............................. H03L 7/089; H03L 7/093
[52] U.S. Cl. .............................. 331/1 A; 331/17; 331/27; 327/7; 327/12; 327/157; 327/159
[58] Field of Search .................................. 331/25, 27, 17, 331/1 A; 327/7, 8, 9, 12, 157, 159

[56] References Cited

U.S. PATENT DOCUMENTS

| | | | |
|---|---|---|---|
| 4,422,176 | 12/1983 | Summers | 331/1 A |
| 5,027,085 | 6/1991 | DeVito | 331/1 A |
| 5,432,480 | 7/1995 | Popescu | 331/11 |
| 5,534,821 | 7/1996 | Akiyama et al. | 331/8 |
| 5,546,052 | 8/1996 | Austin et al. | 331/1 A |

*Primary Examiner*—Siegfried H. Grimm

[57] ABSTRACT

A phase detector for a phase-locked loop ("PLL") circuit under control of a local oscillating clock ("LOSC") signal and a method of operation thereof. The phase detector includes: (1) a first circuit that receives a reference data ("REF") signal and the LOSC signal and develops therefrom an up pulse and a delayed data signal, (2) a second circuit, having an input coupled to an output of the first circuit, that receives the delayed data signal and the LOSC signal and develops therefrom at least one down pulse, a period of the at least one down pulse being substantially equal to a period of the LOSC signal and (3) a charge pump, having a predetermined up current setting and a predetermined down current setting, the predetermined down current setting being different from the up current setting to compensate for the period of the at least one down pulse, that receives the up pulse and the at least one down pulse and develops therefrom a voltage-controlled oscillator ("VCO") drive signal, the period of the at least one down pulse being substantially equal to the period of the LOSC signal to render the VCO drive signal less sensitive to variations in LOSC signal duty cycle.

20 Claims, 4 Drawing Sheets

5,770,976

LOCAL CLOCK DUTY CYCLE INDEPENDENT PHASE DETECTOR AND METHOD OF OPERATION THEREOF

TECHNICAL FIELD OF THE INVENTION

The present invention is directed, in general, to phase-locked loop ("PLL") circuits and, more specifically, to a phase detector for a PLL circuit that does not depend upon the duty cycle of the local clock that drives its operation and a method of operation thereof.

BACKGROUND OF THE INVENTION

The phase-locked loop (PLL) is a well-known building block that is used in a wide variety of applications. The circuit generally comprises a phase detector that detects the difference in phase between an external reference frequency and a locally-generated oscillator frequency, a charge pump that adjusts the level of a control voltage signal ("CV") according to the detected phase difference, a low pass filter ("LPF") for removing noise from the control voltage and slowing the response of the PLL to prevent overshoots or oscillations, a voltage-controlled oscillator ("VCO") which produces an oscillating output having a frequency that is determined by the level of the filtered control voltage. The VCO output is then fed back to the phase detector as the local oscillator frequency input, either directly or indirectly through a clock frequency divider.

In response to a detected phase difference between the external reference frequency (hereafter referred to as the "REF signal") and the local oscillator frequency (hereafter referred to simply as the "LOSC signal"), the phase detector causes the charge pump to increase or decrease the level of the control voltage, CV. The change in CV causes a corresponding increase or decrease in the frequency of the LOSC signal on the VCO output. The operation of the PLL is such that the change in frequency of the LOSC signal tends to erase the detected phase difference. The phase difference will be erased when the LOSC signal matches the frequency and phase of the REF signal (or a multiple thereof, if a clock frequency divider is used). Thus, the control voltage, CV, produced by the charge pump settles at a level that tunes the frequency of the LOSC signal at the VCO output to the frequency of the externally supplied REF signal.

Thereafter, if the frequency of the REF signal changes to a new level, the phase detector detects a phase difference and causes the charge pump to change the level of CV. This, in turn, adjusts the frequency of the LOSC signal at the VCO output so that it tracks the REF signal and erases the detected phase difference. CV then settles at a new level that tunes the frequency of the LOSC signal to the new frequency of the REF signal. Similarly, if the LOSC signal output of VCO begins to "drift" with respect to the REF signal, a phase difference will be detected and the control voltage, CV, will be adjusted so as to correct the drift and bring the LOSC signal back in synchronization with the REF signal.

Thus, the PLL "locks onto" the frequency of the REF signal and produces an LOSC signal that is continually tuned to the frequency of the REF signal (or a multiple thereof). From this it can be seen that one use of a PLL would be to produce a strong, clean local oscillating frequency in an RF receiver that is synchronized to a weak, noisy externally received RF clock signal.

The operation of a PLL frequently deteriorates at high frequencies. This is in part because many types of PLLs operate best when the LOSC signal produced by VCO has a 50% duty cycle (i.e., a square wave). This optimal 50% duty cycle is difficult to maintain at high frequencies. The result is that the phase detector operates the charge pump (and therefore the control voltage, CV) in an unbalanced manner when the duty cycle differs significantly from 50%.

Therefore, what is needed in the art is a phase detector for a PLL circuit that does not depend upon the duty cycle of the local clock that drives its operation.

SUMMARY OF THE INVENTION

To address the above-discussed deficiencies of the prior art, the present invention provides a phase detector for a PLL circuit under control of a local oscillating clock ("LOSC") signal and a method of operation thereof. The phase detector includes: (1) a first circuit that receives a reference data ("REF") signal and the LOSC signal and develops therefrom an up pulse and a delayed data signal, (2) a second circuit, having an input coupled to an output of the first circuit, that receives the delayed data signal and the LOSC signal and develops therefrom at least one down pulse, a period of the at least one down pulse being substantially equal to a period of the CLK signal and (3) a charge pump, having a predetermined up current setting and a predetermined down current setting, the predetermined down current setting being different from the up current setting to compensate for the period of the at least one down pulse, that receives the up pulse and the at least one down pulse and develops therefrom a VCO drive signal, the period of the at least one down pulse being substantially equal to the period of the CLK signal to render the VCO drive signal less sensitive to variations in CLK signal duty cycle.

The present invention therefore introduces the broad concept of decreasing the dependency of the up/down pulses that are produced by a phase detector on the duty cycle of the LOSC signal. As stated above, the prior art phase detector relies upon a 50% LOSC signal duty cycle. As the period of the LOSC signal decreases (indicating an increase in LOSC signal frequency) the 50% duty cycle assumption becomes untenable. By providing a circuit that is less sensitive (and most preferably immune) to variations in duty cycle, the VCO is driven more reliably, yielding a more accurate PLL circuit.

In one embodiment of the present invention, the first circuit comprises a DQ flip-flop and an XOR gate having inputs thereof coupled to a D input and a Q output of the DQ flip-flop to provide the up pulse, the LOSC signal received into the first circuit being non-inverted. Those skilled in the art will recognize that other logic circuitry may be employed in place of the DQ flip-flop and the XOR gate to provide the up pulse.

In one embodiment of the present invention, the second circuit comprises a DQ flip-flop and an XOR gate having inputs thereof coupled to a D input and a Q output of the DQ flip-flop to provide the at least one down pulse, the LOSC signal received into the second circuit being non-inverted. Those skilled in the art will recognize that other logic circuitry may be employed in place of the DQ flip-flop and the XOR gate to provide the down pulse. Further, in contrast to the prior art, the second circuit receives a non-inverted LOSC signal. This causes the second circuit to provide (in this embodiment) a single down pulse that has a period approximating that of the LOSC signal itself.

In an alternative embodiment of the present invention, the second circuit comprises first and second serially-coupled DQ flip-flops and first and second XOR gates, the first XOR gate having inputs thereof coupled to a D input and a Q output of the first DQ flip-flop to provide a first down pulse, the second XOR gate having inputs thereof coupled to a D input and a Q output of the second DQ flip-flop to provide a second down pulse, the LOSC signal received into the first DQ flip-flop being inverted and the LOSC signal received into the second DQ flip-flop being non-inverted. Those skilled in the art will recognize that other logic circuitry may be employed in place of the DQ flip-flop and the XOR gate to provide the first and second down pulses. As above, in contrast to the prior art, the first DQ flip-flop of the second circuit receives a non-inverted LOSC signal. This causes the second circuit to provide (in this alternative embodiment) two down pulses that together have a period approximating that of the LOSC signal.

In one embodiment of the present invention, the phase detector further comprises a VCO that receives the VCO drive signal and develops therefrom an output signal having a frequency that depends upon a voltage of the VCO drive signal. Those skilled in the art are familiar with the structure and operation of a VCO and their utility in PLL circuits. The present invention recognizes that the up and down pulses can be made less sensitive to changes in LOSC signal period by increasing the length of the at least one down pulse to the full period of the LOSC signal. The up and down current settings of the charge pump can be varied to compensate for the longer down pulse, resulting in a VCO drive signal that drives the VCO more reliably, resulting in an overall improvement in PLL circuit improvement.

In one embodiment of the present invention, the period of the LOSC signal is less than 50 nanoseconds. At such short periods, maintaining the LOSC signal at a 50% duty cycle becomes difficult. Accordingly, the present invention's reduced sensitivity to variations in LOSC signal duty cycle is particularly beneficial at such short periods.

In one embodiment of the present invention, the predetermined down current setting is half of the down current setting. Again, since the down pulse is lengthened, the down current setting is reduced to compensate for the extra length. Since, in this embodiment, the down current setting is halved, it is implied that the down pulse is doubled in length as it substantially assumes the full period of the LOSC signal.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
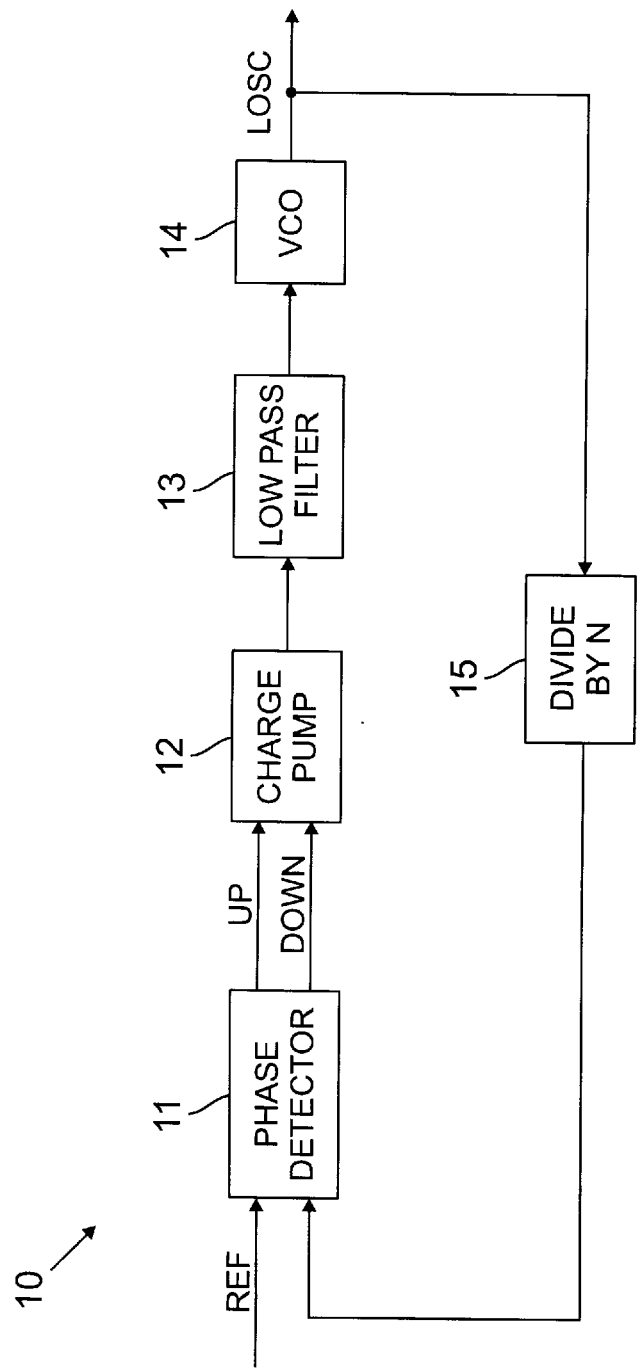
FIG. 1 illustrates an exemplary phase-locked loop.

FIG. 1 illustrates an exemplary phase-locked loop 10. Phase locked loop (PLL) 10 comprises phase detector 11, charge pump 12, low-pass filter (LPF) 13, voltage-controlled oscillator (VCO) 14 and frequency divider 15. VCO 14 produces the local oscillating (LOSC) signal that is fed back through frequency divider 15 to become one of the inputs to phase detector 11. The other input to phase detector 11 is the externally-received reference (REF) signal.

Frequency divider 15 divides the frequency of the LOSC signal by a factor of N, where N is an integer. Typically, frequency divider 15 is a programmable counter that increments on the rising or falling edges of pulses in the LOSC signal. The frequency of the output of frequency divider 15 is given by $f_{LOSC}/N$, where $f_{LOSC}$ is the frequency of the LOSC signal. For the purpose of simplicity in discussing the present invention and the operation of phase-locked loop 10, it will be assumed hereafter that N=1, such that the output frequency of frequency divider 15 is equal to the frequency of the LOSC signal.

Phase detector 11 detects the difference in phase between the edge of a pulse in the REF signal and the edge of a pulse in the LOSC signal. Depending on whether the frequency and phase of the LOSC signal leads or lags the REF signal, phase detector 11 will produce UP pulses and DOWN pulses of varying pulse widths, which are applied to charge pump 12. The UP and DOWN pulses either charge or discharge a storage element, usually a large capacitor, in charge pump 12. A wide variety of charge pump schemes are present in the prior art. However, the UP signal generally controls a transistor which charges up the capacitive storage element and the DOWN signal generally controls a transistor which discharges the capacitive element in charge pump 12.

When the LOSC signal and the REF signal are locked in phase, the pulse widths of the UP signal and the DOWN signal are approximately equal. Therefore, in equilibrium, the total amount of charge added to the storage capacitor in charge pump 12 in each cycle of UP and DOWN pulses is equal to the total amount of charge discharged from the capacitive element. This results in no net change in the charge and voltage level on the storage capacitor.

Generally, the frequency of the UP and DOWN pulses from phase detector 11 is very high relative to the size of the storage capacitor in charge pump 12. Each UP pulse or DOWN pulse creates only a small net change in the voltage level on the charge pump 12 storage capacitor. Therefore, a relatively large number of UP pulses or DOWN pulses are required to cause a significant change in the voltage level on the storage capacitor in charge pump 12. This advantageously prevents the phase-locked loop 10 from overreacting to transient voltage spikes in a noisy REF signal.

The voltage level on the charge pump 12 storage capacitor is the control voltage (CV) signal used to control the frequency of the output of VCO 14. Any "ripple" that may exist in the CV signal due to the UP and DOWN pulses is removed by low pass filter 13. The CV signal controls the frequency of the output of VCO 14 such that as CV increases, the frequency of the LOSC signal increases and as CV decreases, the frequency of the LOSC signal decreases correspondingly.

Prior art phase detectors and charge pumps similar to the above-described embodiment are disclosed in greater detail in U.S. Pat. No. 5,546,052 to Austin et al. (the "'052 patent") and U.S. Pat. No. 5,534,821 to Akiyama et al. (the "'821 patent"). Conventional phase-locked loop circuit design and operation is more fully discussed in *The Art of Electronics,* by Paul Horowitz and Winfield Hill, Cambridge University Press (2nd ed. 1991) (the "Horowitz text"). Each of the '052 patent, the '821 patent, and the Horowitz text is hereby incorporated by reference for all purposes.

Figure 2A:
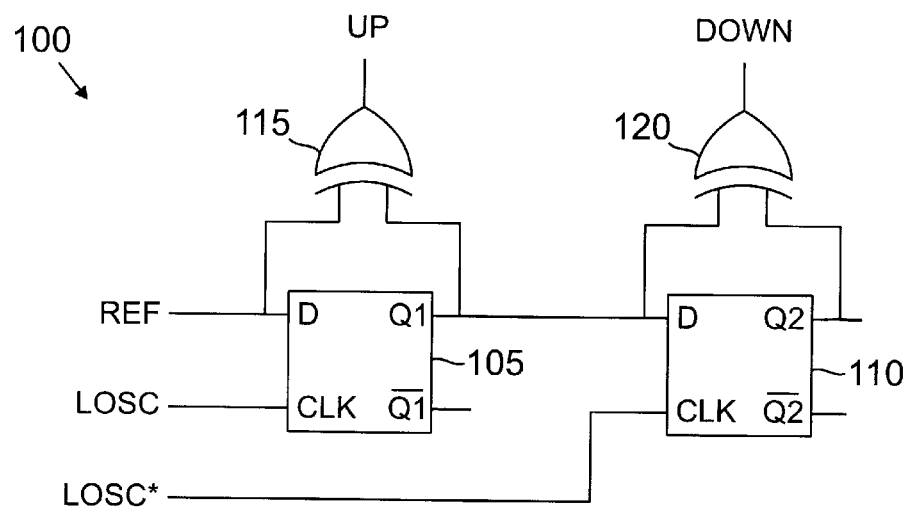
FIG. 2A illustrates a phase detector in accordance with the prior art.
Figure 2B:
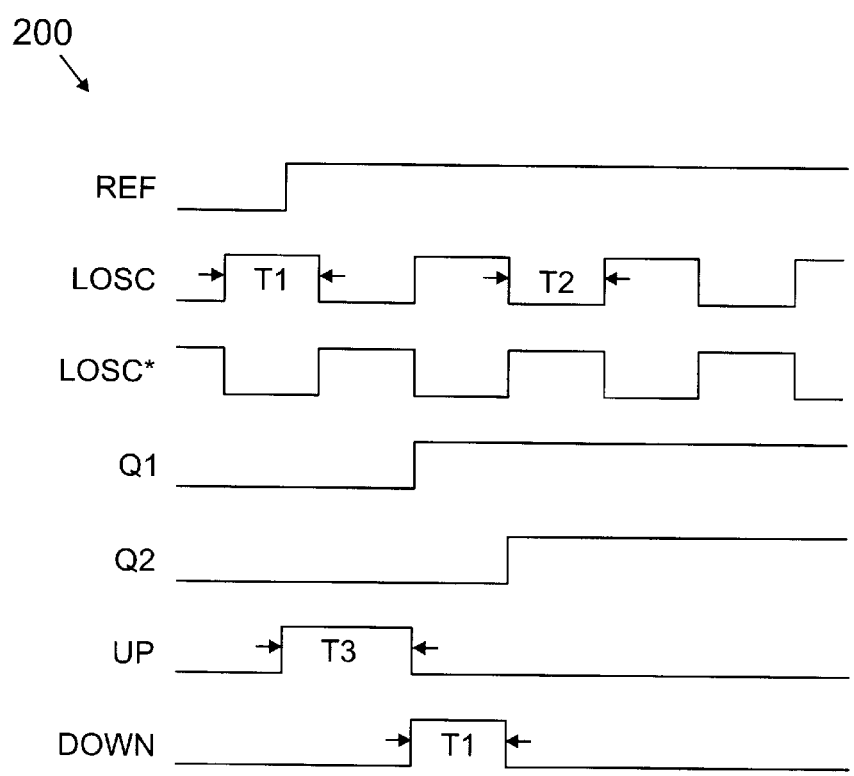
FIG. 2B depicts a timing diagram which illustrates the operation of the phase detector in FIG. 2A.

FIG. 2A illustrates phase detector 100 in accordance with the prior art. FIG. 2B depicts timing diagram 200, which illustrates an exemplary operation of phase detector 100 in FIG. 2A. Phase detector 100 comprises flip-flop (FF) 105, flip-flop (FF) 110, Exclusive-OR (XOR) gate 115 and Exclusive-OR (XOR) gate 120. Phase detector 100 receives the REF signal, the LOSC signal and an LOSC* signal, which is the inverted value of the LOSC signal. LOSC* may be provided directly by frequency divider 115 or by an intervening inverter (not shown) between frequency divider 15 and phase detector 11.

FIG. 2B shows a rising edge of the REF signal arriving ahead of the rising edge of the LOSC signal. FF 105 is triggered by the rising edge of the LOSC signal. FF 110 is triggered by the rising edge of the LOSC*. Ideally, the LOSC signal and the LOSC* signal are square waves having a duty cycle very close to 50%. Thus, the pulse width of a Logic 1, shown as period T1 in FIG. 2B, is equal to the pulse width of a Logic 0, shown as period T2 in FIG. 2B. The UP signal produced by XOR gate 115 is determined by the REF signal and the Q1 output of FF 105. The DOWN signal is determined by the Q1 output of FF 105 and the Q2 output of FF 110.

The width of the UP pulse is determined by the time difference between the rising edge of the REF signal and the next sequential rising edge of the LOSC signal. The width of the DOWN pulse is determined by the time difference between a rising edge on the Q1 output of FF 105 and the rising edge of a Q2 output on FF 110. Since Q1 and Q2 are both triggered by rising edges on the LOSC signal and the LOSC* signal, respectively, the width of the DOWN pulse (shown as Ti) is equal to the width of T1 or T2 (i.e., proportional to the duty cycle of the LOSC/LOSC* signal).

In the illustrated example, the rising edge of the REF signal leads the next sequential rising edge of the LOSC signal by more than a half cycle of the LOSC signal. Therefore, the width, T3, of the UP pulse is greater than the width of the DOWN pulse. The greater width of the UP pulse causes charge pump 12 to place a greater charge on the storage capacitor during the UP pulse than is discharged during the DOWN pulse. Accordingly, the voltage level on the storage capacitor in charge pump 12 rises.

Since the voltage level on the charge pump 12 storage capacitor becomes the control voltage, CV, after filtering by LPF 13, the output of VCO 14 increases in frequency. The frequency of VCO 14 output continues to rise, thereby narrowing the width, T3, of the UP pulse until the T3 is finally equal to the width, T1 of the DOWN pulse. At that point equilibrium is reached and the LOSC signal is locked in phase with the REF signal.

The above-described phase detection scheme works suitably well at relatively low frequencies where it is easy to maintain a 50% duty cycle in the LOSC and LOSC* signals. However, at high frequencies a 50% duty cycle is not easily achieved. Since the width of the DOWN pulse is proportional to the duty cycle of the LOSC and LOSC* signal, an inaccuracy will be introduced into phase detector 100 by the imperfect duty cycle. This will result in a phase difference between the REF signal and the LOSC signal even at equilibrium.

Figure 3A:
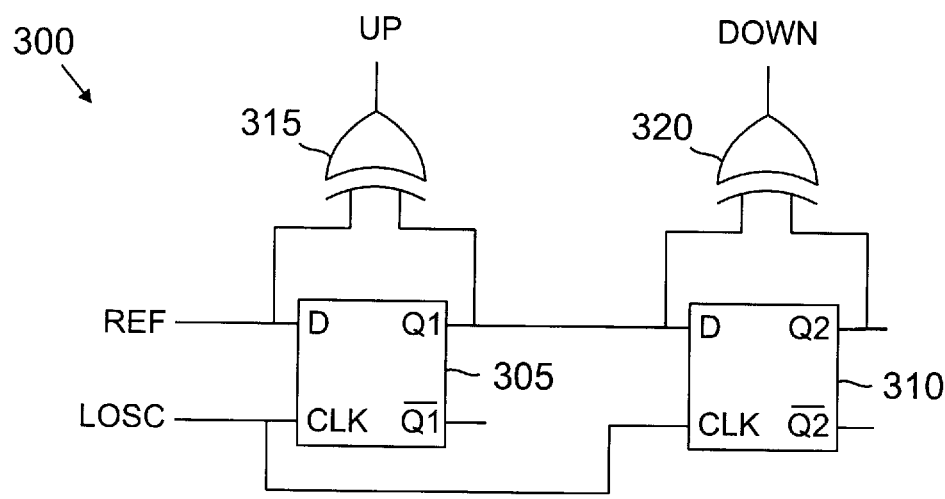
FIG. 3A illustrates an improved phase detector in accordance with a first embodiment of the present invention.
Figure 3B:
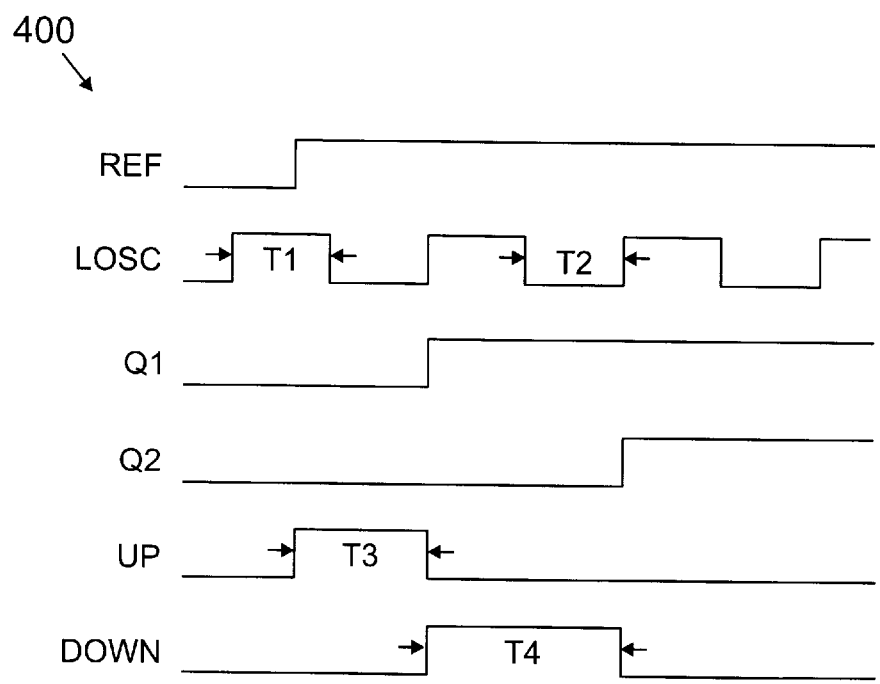
FIG. 3B depicts a timing diagram which illustrates the operation of the phase detector in FIG. 3A.

FIG. 3A illustrates improved phase detector 300 in accordance with a first embodiment of the present invention. FIG. 3B depicts timing diagram 400, which illustrates the operation of phase detector 300 in FIG. 3A. The LOSC signal is used to strobe FF 305 and FF 310. The UP pulse at the output of XOR gate 315 is determined by the values of the REF signal and the Q1 output of FF 305. The DOWN pulse at the output of XOR gate 320 is determined by the values of the Q1 output of FF 305 and the Q2 output of FF 310.

However, in this embodiment the width, T4, of the DOWN pulse is independent of the clock duty cycle, since FF 305 and FF 310 are both clocked by rising edges of the CLOCK signal. By setting the "down" current in charge pump 12 to one half the "up" current, equilibrium can be achieved when the T3=T4/2. Thus, the DOWN pulse is equal to one period of the LOSC clock and the UP pulse is forced to one half of the DOWN pulse. Thus, neither the UP pulse nor the DOWN pulse is affected by the duty cycle of the LOSC clock.

Figure 4A:
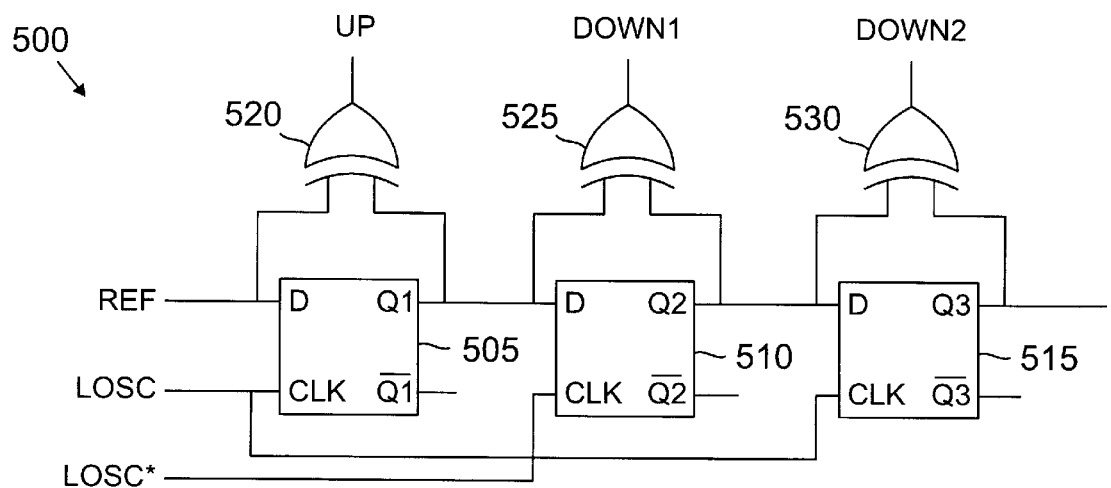
FIG. 4A illustrates an improved phase detector in accordance with a second embodiment of the present invention.
Figure 4B:
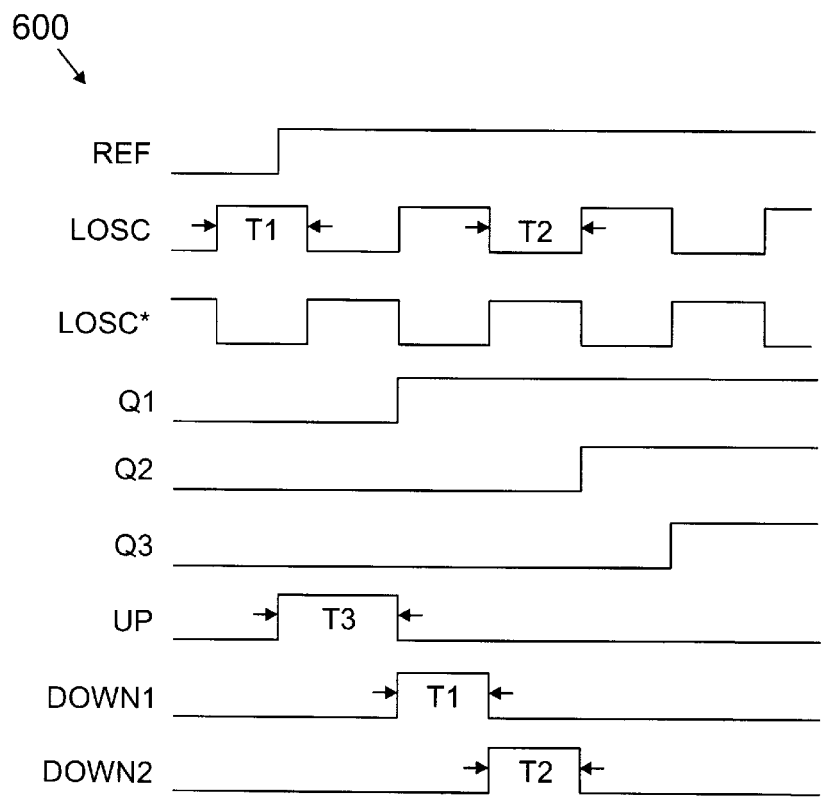
FIG. 4B depicts a timing diagram which illustrates the operation of the phase detector in FIG. 4A.

FIG. 4A illustrates improved phase detector 500 in accordance with a second embodiment of the present invention. FIG. 4B depicts timing diagram 600, which illustrates the operation of phase detector 500 in FIG. 4A. The LOSC signal is used to strobe FF 505 and FF 515, while the LOSC* signal is used to stroke FF 510. The UP pulse at the output of XOR gate 520 is determined by the values of the REF signal and the Q1 output of FF 505. The DOWN1 pulse at the output of XOR gate 525 is determined by the values of the Q1 output of FF 505 and the Q2 output of FF 510. The DOWN2 pulse at the output of XOR gate 530 is determined by the values of the Q2 output of FF 510 and the Q3 output of FF 515. The LOSC signal is used to strobe FF 505 and FF 515. The LOSC* signal is used to strobe FF 510.

The width of the DOWN1 pulse is equal to T1, the width of a Logic 1 level in the LOSC clock signal. The width of the DOWN2 pulse is equal to T2, the width of a Logic 1 level in the LOSC* clock signal (or the width of a Logic 0 level in the LOSC clock signal). By summing the DOWN1 and DOWN2 pulses, a combined DOWN pulse is obtained that has a pulse width equal to the period of the LOSC signal. The combined DOWN pulse is therefore independent of the duty cycle of the LOSC signal, even if the individual DOWN1 and DOWN2 pulses are not. Once again, by setting the "down" current in charge pump 12 to one half the "up" current, equilibrium can be achieved when the T3=(T1+T2)/2.

FIGS. 3A and 4A depict the use of DQ type flip-flops to implement the present invention. However, it should be understood that the illustrated embodiments of the present invention may readily be implemented using other types of logic gates.

Although the present invention and its advantages have been described in detail, those skilled in the art should understand that they can make various changes, substitutions and alterations herein without departing from the spirit and scope of the invention in its broadest form.

What is claimed is:

1. A phase detector for a phase-locked loop (PLL) circuit under control of a local oscillating clock ("LOSC") signal, said phase detector comprising:

a first circuit that receives a reference data ("REF") signal and said LOSC signal and develops therefrom an up pulse and a delayed data signal;

a second circuit, having an input coupled to an output of said first circuit, that receives said delayed data signal and said LOSC signal and develops therefrom at least one down pulse, a period of said at least one down pulse being substantially equal to a period of said LOSC signal; and a charge pump, having a predetermined up current setting and a predetermined down current setting, said predetermined down current setting being different from said up current setting to compensate for said period of said at least one down pulse, that receives said up pulse and said at least one down pulse and develops therefrom a voltage-controlled oscillator (VCO) drive signal, said period of said at least one down pulse being substantially equal to said period of said LOSC signal to render said VCO drive signal less sensitive to variations in LOSC signal duty cycle.

2. The phase detector as recited in claim 1 wherein said first circuit comprises a DQ flip-flop and an XOR gate having inputs thereof coupled to a D input and a Q output of said DQ flip-flop to provide said up pulse, said LOSC signal received into said first circuit being non-inverted.

3. The phase detector as recited in claim 1 wherein said second circuit comprises a DQ flip-flop and an XOR gate having inputs thereof coupled to a D input and a Q output of said DQ flip-flop to provide said at least one down pulse, said LOSC signal received into said second circuit being non-inverted.

4. The phase detector as recited in claim 1 wherein said second circuit comprises first and second serially-coupled DQ flip-flops and first and second XOR gates, said first XOR gate having inputs thereof coupled to a D input and a Q output of said first DQ flip-flop to provide a first down pulse, said second XOR gate having inputs thereof coupled to a D input and a Q output of said second DQ flip-flop to provide a second down pulse, said LOSC signal received into said first DQ flip-flop being inverted and said LOSC signal received into said second DQ flip-flop being non-inverted.

5. The phase detector as recited in claim 1 further comprising a VCO that receives said VCO drive signal and develops therefrom an output signal having a frequency that depends upon a voltage of said VCO drive signal.

6. The phase detector as recited in claim 1 wherein said period of said LOSC signal is less than 50 nanoseconds.

7. The phase detector as recited in claim 1 wherein said predetermined down current setting is half of said up current setting.

8. For use with a phase-locked loop (PLL) circuit under control of a local oscillating clock ("LOSC") signal, a method of detecting phase, comprising the steps of:

developing an up pulse and a delayed data signal from a reference data ("REF") signal and said LOSC signal;

developing at least one down pulse from said delayed data signal and said LOSC signal, a period of said at least one down pulse being substantially equal to a period of said LOSC signal; and receiving said up pulse and said at least one down pulse into a charge pump having a predetermined up current setting and a predetermined down current setting, said predetermined down current setting being different from said up current setting to compensate for said period of said at least one down pulse, said charge pump developing from said up pulse and said at least one down pulse therefrom a voltage-controlled oscillator (VCO) drive signal, said period of said at least one down pulse being substantially equal to said period of said LOSC signal to render said VCO drive signal less sensitive to variations in LOSC signal duty cycle.

9. The method as recited in claim 8 wherein said step of developing said up pulse comprises the step of providing said up pulse from a DQ flip-flop and an XOR gate having inputs thereof coupled to a D input and a Q output of said DQ flip-flop, said LOSC signal received into said first circuit being non-inverted.

10. The method as recited in claim 8 wherein said step of developing said at least one down pulse comprises the step of providing said at least one down pulse from a DQ flip-flop and an XOR gate having inputs thereof coupled to a D input and a Q output of said DQ flip-flop, said LOSC signal received into said second circuit being non-inverted.

11. The method as recited in claim 8 wherein said step of developing said at least one down pulse comprises the step of providing first and second down pulses from first and second serially-coupled DQ flip-flops and first and second XOR gates, said first XOR gate having inputs thereof coupled to a D input and a Q output of said first DQ flip-flop, said second XOR gate having inputs thereof coupled to a D input and a Q output of said second DQ flip-flop, said LOSC signal received into said first DQ flip-flop being inverted and said LOSC signal received into said second DQ flip-flop being non-inverted.

12. The method as recited in claim 8 further comprising the step of receiving said VCO drive signal into a VCO, said VCO developing therefrom an output signal having a frequency that depends upon a voltage of said VCO drive signal.

13. The method as recited in claim 8 wherein said period of said LOSC signal is less than 50 nanoseconds.

14. The method as recited in claim 8 wherein said predetermined down current setting is half of said up current setting.

15. A phase-locked loop (PLL) circuit, comprising:

a local clock that produces a local oscillating clock ("LOSC") signal;

a voltage-controlled oscillator (VCO) that develops an output signal having a frequency that depends upon a voltage of a received VCO drive signal; and a phase detector, including:

a first circuit that receives a reference data ("REF") signal and said LOSC signal and develops therefrom an up pulse and a delayed data signal, a second circuit, having an input coupled to an output of said first circuit, that receives said delayed data signal and said LOSC signal and develops therefrom at least one down pulse, a period of said at least one down pulse being substantially equal to a period of said LOSC signal, and a charge pump, having a predetermined up current setting and a predetermined down current setting, said predetermined down current setting being different from said up current setting to compensate for said period of said at least one down pulse, that receives said up pulse and said at least one down pulse and develops therefrom said VCO drive signal, said period of said at least one down pulse being substantially equal to said period of said LOSC signal to render said VCO drive signal less sensitive to variations in LOSC signal duty cycle.

16. The PLL as recited in claim 15 wherein said first circuit comprises a DQ flip-flop and an XOR gate having inputs thereof coupled to a D input and a Q output of said DQ flip-flop to provide said up pulse, said LOSC signal received into said first circuit being non-inverted.

17. The PLL as recited in claim 15 wherein said second circuit comprises a DQ flip-flop and an XOR gate having inputs thereof coupled to a D input and a Q output of said DQ flip-flop to provide said at least one down pulse, said LOSC signal received into said second circuit being non-inverted.

18. The PLL as recited in claim 15 wherein said second circuit comprises first and second serially-coupled DQ flip-flops and first and second XOR gates, said first XOR gate having inputs thereof coupled to a D input and a Q output of said first DQ flip-flop to provide a first down pulse, said second XOR gate having inputs thereof coupled to a D input and a Q output of said second DQ flip-flop to provide a second down pulse, said LOSC signal received into said first DQ flip-flop being inverted and said LOSC signal received into said second DQ flip-flop being non-inverted.

19. The PLL as recited in claim 15 wherein said period of said LOSC signal is less than 50 nanoseconds.

20. The PLL as recited in claim 15 wherein said predetermined down current setting is half of said up current setting.

* * * * *